United States Patent
Olsen

(10) Patent No.: US 6,653,200 B2
(45) Date of Patent: Nov. 25, 2003

(54) TRENCH FILL PROCESS FOR REDUCING STRESS IN SHALLOW TRENCH ISOLATION

(75) Inventor: Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

(21) Appl. No.: 09/771,084

(22) Filed: Jan. 26, 2001

(65) Prior Publication Data

US 2002/0102814 A1 Aug. 1, 2002

(51) Int. Cl.$^7$ .............................................. H01L 21/76
(52) U.S. Cl. ...................... 438/424; 438/435; 438/439
(58) Field of Search ................................ 438/424, 435, 438/439

(56) References Cited

U.S. PATENT DOCUMENTS

| | | | | |
|---|---|---|---|---|
| 3,767,483 A | * | 10/1973 | Tokuyama et al. | 438/197 |
| 5,902,127 A | | 5/1999 | Park | 438/435 |
| 6,005,279 A | * | 12/1999 | Luning | 257/510 |
| 6,010,948 A | | 1/2000 | Yu et al. | 438/436 |
| 6,124,427 A | * | 9/2000 | Atwood | 528/485 |

OTHER PUBLICATIONS

IBM Technical Disclosure Bulletin No. 80081037, Aug. 1980.*

Faran Nouri, Gregory Scott, Mark Rubin, Martin Manley & Peter Stolk. *Narrow Device Issues in Deep–Submicron Technologies–the Influence of Stress, TED and Segregation on Device Performance.* European Solid State Device and Research Conference (Sep. 2000).

A. Steegan, A. Lauwers, M. de Potter, G. Badenes, R. Rooyackers & K. Maex. *Silicide and Shallow Trench Isolation Line Width Dependent Stress Induced Junction Leakage.* VLSI Technology Digest of Technical Papers (2000).

Gregory Scot, Jeffrey, Lutze, Mark Rubin, Faran Nouri, & Martin Manley. *NMOS Drive Current Reduction Caused by Transistor Layout and Trench Isolation Induced Stress.* IEDM Tech. Digest, p. 827 (1999).

* cited by examiner

Primary Examiner—Olik Chaudhuri
Assistant Examiner—William M. Brewster
(74) Attorney, Agent, or Firm—Blakely, Sokoloff, Taylor & Zafman

(57) ABSTRACT

The present invention provides a method of reducing stress in a shallow trench isolation region of a MOSFET device comprising the step of forming a dielectric in the shallow trench isolation region wherein the thermal expansion coefficient of the dielectric matches the thermal expansion coefficient of silicon in the substrate thereby reducing stress in the shallow trench isolation region. Also provided is a method of forming a dielectric filled, shallow trench isolation region for a MOSFET device where the shallow trench is filled with an an aluminosilicate, an aluminum silicon oxynitride or silicon oxynitride dielectric alloys.

19 Claims, 6 Drawing Sheets

TRENCH FILL PROCESS FOR REDUCING STRESS IN SHALLOW TRENCH ISOLATION

BACKGROUND OF THE INVENTION

1. Field of the Invention

The present invention generally relates to the fields of semiconductor fabrication and shallow trench isolation techniques. More particularly, the present invention provides a method of using a silicate alloy trench fill process to reduce stress in a shallow trench isolation region of a MOSFET device.

2. Brief Description of the Related Art

Shallow trench isolation (STI) technology represents a superior application of device-level processing primarily for devices at or below 0.25 microns. Shallow trench isolation provides for better packing density. However, as devices become smaller and more densely packed, problems associated with stress due to trench processing, particularly thermal cycling, occur. Smaller device geometries require higher aspect ratios in shallow trenches and dielectric films deposited into these high aspect ratio trenches are more prone to containing gaps and voids. Additionally, these dielectric films must exhibit low shrinkage during subsequent heating steps to eliminate the formation of gaps and voids in the dielectric fill. Such defects contribute to performance unreliability of the device.

Compressive stress in silicon, through the piezoresistive effect is responsible for the degradation of electron mobility and creates a reduced-mobility area near the trench edge. If it is severe enough, anisotropic compressive stress generated during shallow trench formation causes crystalline defects or dislocations in the silicon substrate resulting in high leakage currents. With extra annealing steps, stress can be reduced and dislocations minimized. The anneal conditions limit device design and may not be preferred (FIG. 1). However, in shallow trench isolation structures in highly integrated semiconductor devices, the profile of the edge of the shallow trench determines the electrical characteristics of the device.

It has been suggested that a polysilicon dielectric fill be deposited in the shallow trench and oxidized therein. A narrow width trench is completely filled during the oxidation of the polysilicon within the trench because of volumetric expansion. However, stress is applied at the active region of the sidewall of the trench. Also, due to step coverage limitations of the polysilicon within the trench, it is difficult to effectively prevent a collapse of the upper edge of the trench.

A Metal Oxide Silicon Field Effect Transistor (MOSFET) uses an oxide film as an insulator. Typically, an n-MOSFET or NMOS structure is comprised of paired n-type source and drain regions implanted in the surface of a silicon substrate, of a gate oxide film formed on the silicon substrate between the source and the drain regions and of a gate electrode formed on the surface of the gate oxide film (FIG. 2). In an NMOS device, the PWell may be doped with boron. A channel region between the source region and the drain region is formed. The channel length, i.e., the distance between the source and the drain, is shorter than the gate length.

For an NMOS transistor to operate, a threshold voltage must be applied across the gate and the source electrodes. The amount of voltage applied at the gate necessary to reach this threshold is dependent upon such factors as the gate material, the gate insulation material, the gate insulation thickness, the channel doping, the impurities at the silicon-insulator interface, and the source-to-substrate voltage between the source and the substrate.

To increase the speed of MOSFET devices in general, structures are scaled down to smaller sizes. This means that the gate length is reduced with the concomitant reduction in channel length. Such scaling down can result in the loss of gate electrode control or voltage threshold roll-off. As the channel length of a transistor decreases, the threshold voltage also decreases causing an inverse narrow width effect.

When implementing a trench isolation structure, a strong electric field forms locally in a channel area proximate to the corner of the trench. Thus inversion can easily occur even at low voltages; the current that flows between the source and the drain thus increases. Stress of the active area of a device generated during STI fabrication only enhances the already increased voltage threshold roll-off resulting from the scaling down of MOSFETS and thereby degrades the electrical performance. Additionally, stress-induced dislocations at the sidewall can degrade yield of integrated circuit products. Solubility of dopants in the dielectric may be dependant on the fill material used, as thermal cycles during device fabrication occur.

Furthermore, with the thermal cycles necessary for device processing, together with the down-scaling of the gate and trench geometries, dopant diffusion, specifically boron in a n NMOS device, through the substrate to the sidewalls and/or through the gate structure and gate dielectric can cause damage to the device. This degrades the control over the threshold voltage of the narrow width devices. Hence, any b or on penetration into the channel region or segregation to the sidewalls causes loss of control over the threshold voltage of the device and hinders performance of the device.

The shallow trench isolation formation process induces compressive stress in the active area of a device and tensile stress at the shallow trench edges, particularly for narrow devices. It is essential to minimize stress during STI thermal cycling in order to maintain the integrity of the dielectric fill material along the trench edges and sidewalls and thereby to protect the active areas of MOSFET devices. The ability of the dielectric fill material to match the expansion/contraction properties of the silicon substrate in the device would significantly reduce such stress and thereby enhance electrical performance of the MOSFET device.

The prior art is deficient in the lack of an effective method of reducing stress in shallow trench isolation devices. The present invention fulfills this long-standing need and desire in the art.

SUMMARY OF THE INVENTION

In one embodiment, the present invention provides a method of reducing stress in a shallow trench isolation region of a MOSFET device comprising the step of forming a dielectric in the shallow trench isolation region wherein the thermal expansion coefficient of the dielectric approximates the thermal expansion coefficient of silicon in the substrate thereby reducing stress in the shallow trench isolation region.

In another embodiment, the present invention provides a method of reducing stress in a shallow trench isolation region of a MOSFET device comprising the steps of adding an aluminum trioxide precursor during deposition of silicon dioxide in a shallow trench isolation trench fill process in the device; and depositing an aluminosilicate alloy in the shallow trench such that a dielectric is formed in the shallow trench isolation region wherein the thermal expansion coefficient of the dielectric approximates the thermal expansion coefficient of silicon in the substrate, thereby reducing stress in the shallow trench isolation region.

In yet another embodiment, the present invention provides a method of forming a dielectric-filled, shallow trench isolation region for a MOSFET device, comprising the steps of forming a pad oxide film on a semiconductor substrate; forming a pad nitride film on the pad oxide film; forming a shallow trench in a field region of the semiconductor substrate through the pad nitride film and the pad oxide film; forming a liner oxide film at the inner walls of the shallow trench by oxidizing the semiconductor substrate; filling the shallow trench with a n aluminosilicate dielectric alloy; and planarizing the surface of the aluminosilicate dielectric alloy thereby forming a shallow trench isolation region.

Other and further aspects, features, and advantages of the present invention will be apparent from the following description of the invention.

BRIEF DESCRIPTION OF THE DRAWINGS

So that the matter in which the above-recited features, advantages and objects of the invention, as well as others which will become clear, are attained and can be understood in detail, more particular descriptions of the invention briefly summarized above may be had by reference to certain embodiments thereof which are illustrated in the appended drawings. These drawings form a part of the specification. It is to be noted, however, that the appended drawings are to be considered illustrative embodiments of the invention and therefore are not to be considered limiting in their scope.

FIG. 1 depicts the dislocations that form on a device if stress is not managed.

DETAILED DESCRIPTION OF THE INVENTION

Figure 1A:
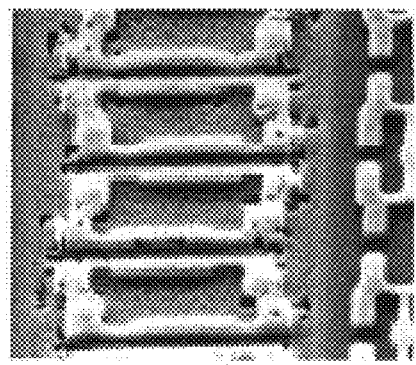
FIG. 1A shows dislocations prior to annealing.
Figure 1B:
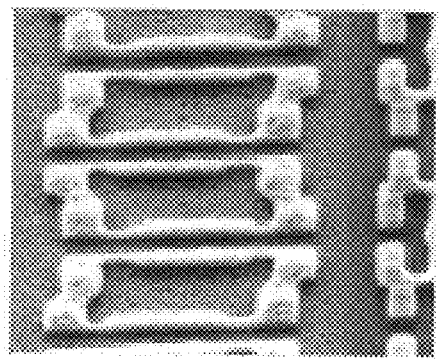
FIG. 1B depicts the reduction in stress and minimization of dislocations on a device after annealing steps.
Figure 2:
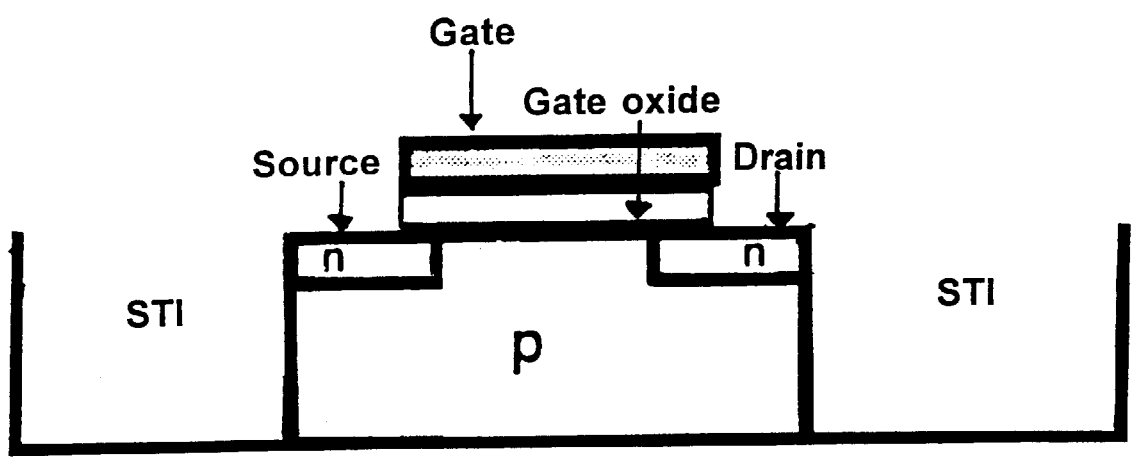
FIG. 2 is a diagram of an isolated NMOS transistor.

The following abbreviations may be used herein: STI: shallow trench isolation; MOSFET: metal oxide silicon field effect transistor; NMOS: n-type MOSFET; CMOS: complementary MOSFET; PMOS: p-type MOSFET; BiCMOS: bipolar complementary MOSFET; SRAM: static random access memory; DRAM: dynamic random access memory; SACVD: sub-atmospheric chemical vapor deposition; HDP: high density plasma; CMP: chemo-mechanical polishing; TEOS: tetraethylorthosilicate; $O_3$: ozone; $SiH_4$: silane; $Al_2O_3$: aluminum trioxide; $SiO_2$: silicon dioxide or oxide; $Si_3N_4$: silicon nitride; $ZrO_2$: zirconium oxide; $ZrSiO_4$: zirconium silicate; Al—Si—O—N: aluminum silicon oxynitride; $Al(CH_3)_3$: trimethyl aluminum; $Al(OCH_3)_3$: aluminum trimethoxide; $C_{12}H_{27}AlO_3$: aluminum tri-sec-butoxide and $C_{15}H_{21}AlO$: aluminum tris(acetylacetonate).

In one embodiment, the present invention provides a method of reducing stress in a shallow trench isolation region of a MOSFET device comprising the step of forming a dielectric in the shallow trench isolation region wherein the thermal expansion coefficient of the dielectric approximates the thermal expansion coefficient of silicon in the substrate thereby reducing stress in the shallow trench isolation region. Such MOSFET devices may be in NMOS, CMOS, PMOS, BiCMOS, Flash, SRAM, and DRAM. This embodiment of the instant invention further provides a method of forming the dielectric in the shallow trench isolation region comprising the steps of: adding an aluminum trioxide precursor during deposition of silicon dioxide in a shallow trench isolation trench fill process in the device; and depositing an aluminosilicate alloy in the shallow trench thereby forming the dielectric. Representative examples of the aluminum trioxide precursor are trimethyl aluminum $Al(CH_3)_3$, aluminum trimethoxide $Al(OCH_3)_3$, aluminum tri-sec-butoxide $C_{12}H_{27}AlO_3$, and aluminum tris(acetylacetonate) $C_{15}H_{21}AlO_6$.

The aluminosilicate alloy comprises from about 20–40% aluminum trioxide alloyed with silicon dioxide. The aluminosilicate alloy may be deposited, via, e.g., high density plasma deposition using silane and oxygen or via sub-atmospheric chemical vapor deposition using tetraethylorthosilicate and ozone. Additionally, a nitrogen source may be added during the HDP deposition to form a n aluminum silicon oxynitride alloy. The compositional range of the aluminum silicon oxynitride alloy is from about 25% aluminum trioxide and about 0% silicon nitride alloyed with about 75% silicon dioxide to about 0% aluminum trioxide and about 57% silicon nitride alloyed with about 43% silicon oxide.

In another embodiment, the present invention provides a method of reducing stress in a shallow trench isolation region of a MOSFET device comprising the steps of adding an aluminum trioxide precursor during deposition of silicon dioxide in a shallow trench isolation trench fill process in the device; and depositing an aluminosilicate alloy in the shallow trench such that a dielectric is formed in the shallow trench isolation region wherein the thermal expansion coefficient of the dielectric approximates the thermal expansion coefficient of silicon in the substrate, thereby reducing stress in the shallow trench isolation region.

In yet another embodiment, the present invention provides a method of forming a dielectric-filled, shallow trench isolation region for a MOSFET device, comprising the steps of forming a pad oxide film on a semiconductor substrate; forming a pad nitride film on the pad oxide film; forming a shallow trench in a field region of the semiconductor substrate through the pad nitride film and the pad oxide film; forming a liner oxide film at the inner walls of the shallow trench by oxidizing the semiconductor substrate; filling the shallow trench with a n aluminosilicate dielectric alloy; and planarizing the surface of the aluminosilicate dielectric alloy thereby forming a shallow trench isolation region. Such MOSFET devices may be in NMOS, CMOS, PMOS, BiCMOS, Flash, SRAM, and DRAM. This embodiment of the present invention can provide a shallow trench having a pad oxide film about 100 Å thick, having a pad nitride film about 1500 Å thick and having a shallow trench 0.25 μm wide and 4000 Å deep. Furthermore, the liner oxide in this shallow trench is formed at a temperature of about 1100° C.

and in an ambient comprising oxygen or oxygen and hydrogen. The aluminosilicate alloy deposited in the shallow trench comprises from about 20–40% aluminum trioxide alloyed with silicon dioxide.

In one aspect of this embodiment there is provided a method of depositing the aluminosilicate dielectric alloy comprising the steps of adding an aluminum trioxide precursor to tetraethylorthosilicate and ozone; and depositing an aluminosilicate dielectric into the shallow trench by sub-atmospheric chemical vapor deposition. In another aspect of this embodiment there is provided an alternative method of depositing the aluminosilicate dielectric comprising the steps of adding an aluminum trioxide precursor to silane and oxygen; and depositing an aluminosilicate dielectric into the shallow trench by high density plasma deposition. Additionally, in this aspect a nitrogen source may be added prior to deposition of the dielectric so that an aluminum silicon oxynitride alloy is formed. The compositional range of the aluminum silicon oxynitride alloy is from about 25% aluminum trioxide and about 0% silicon nitride alloyed with about 75% silicon dioxide to about 0% aluminum trioxide and about 57% silicon nitride alloyed with about 43% silicon oxide. Representative examples of a aluminum trioxide precursors for all of these deposition methods are trimethyl aluminum $Al(CH_3)_3$, aluminum trimethoxide $AL(OCH_3)_3$, aluminum tri-sec-butoxide $C_{12}H_{27}AlO_3$, and aluminum tris(acetylacetonate) $C_{15}H_{21}AlO_6$. Planarization performed on the dielectric film is a chemo-mechanical polishing.

The following definitions are given for the purpose of understanding the present invention. Any terms not expressly defined herein should be given their clear and ordinary meaning in the art.

As used herein, the term, "threshold voltage", shall refer to gate-to-source voltage applied across the gate and source electrodes to cause inversion in the channel at voltages greater that threshold and allow current to flow from drain-to-source; the MOS device drain-to-source current becomes near zero below this threshold voltage.

As used herein, the term, "voltage rolloff", shall refer to the threshold voltage roll-off as device width shrinks.

As used herein, the term, "leakage current", shall refer to current leaking between STI isolated MOSFET devices, either of the same type (NMOS to NMOS) or between opposite types (NMOS to PMOS).

The following examples are given for the purpose of illustrating various embodiments of the invention and are not meant to limit the present invention in any fashion.

EXAMPLE 1
Matching the Linear Thermal Expansion Coefficient of Silicon Using Alumninosilicate Alloys The linear thermal expansion coefficient of silicon is 2.6E-6/° C. while that of silicon dioxide ($SiO_2$) is 0.5E-6/° C. After the $SiO_2$ dielectric is deposited into the shallow trench, further thermal processing steps cause the dielectric to expand and contract at a rate different from the silicon substrate. These unequal expansion/contraction rates cause stress at the trench edge and can expose the active areas thereby degrading electrical performance of the NMOS device.

Figure 3:
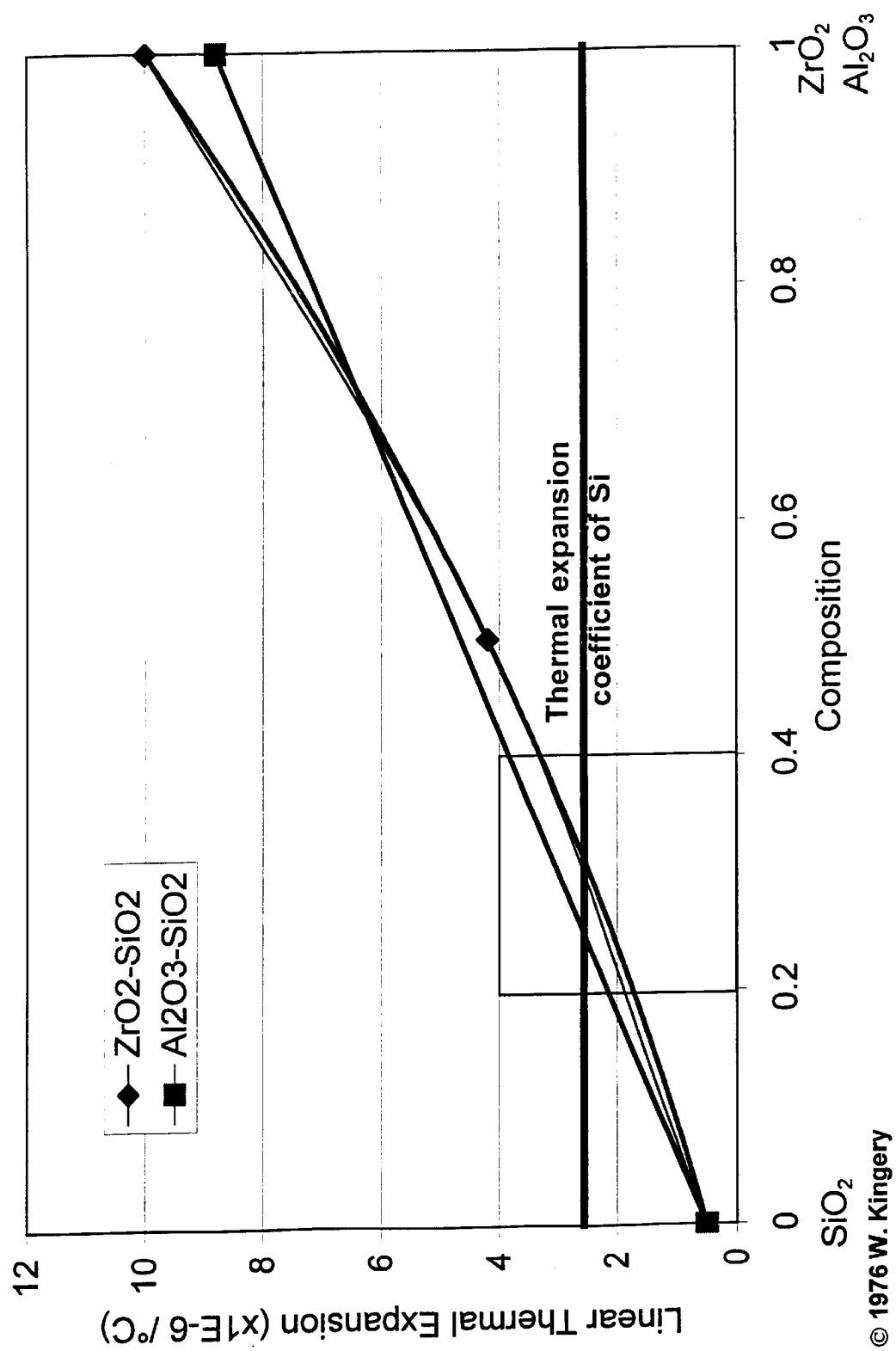
FIG. 3 depicts the thermal expansion coefficients of $ZrO_2$—$SiO_2$ and $Al_2O_3$—$SiO_2$ silicate dielectrics. The composition of the silicate dielectrics are plotted versus their linear thermal expansion coefficients. The thermal expansion coefficient of silicon is indicated at 2.6E-6/° C.

FIG. 3 shows a graph of the linear thermal expansion coefficients of changing compositions of an $Al_2O_3$—$SiO_2$ and a $ZrO_2$—$SiO_2$ silicate dielectric. When the silicate dielectric contains approximately 20–40% of $Al_2O_3$ with the balance being $SiO_2$, the aluminosilicate dielectric will match the thermal expansion/contraction properties of silicon and thus not generate STI stress during thermal cycling. Because of their high temperature stability and the thermodynamic stability of $Al_2O_3$, aluminosilicates are excellent dielectric materials.

Figure 4:
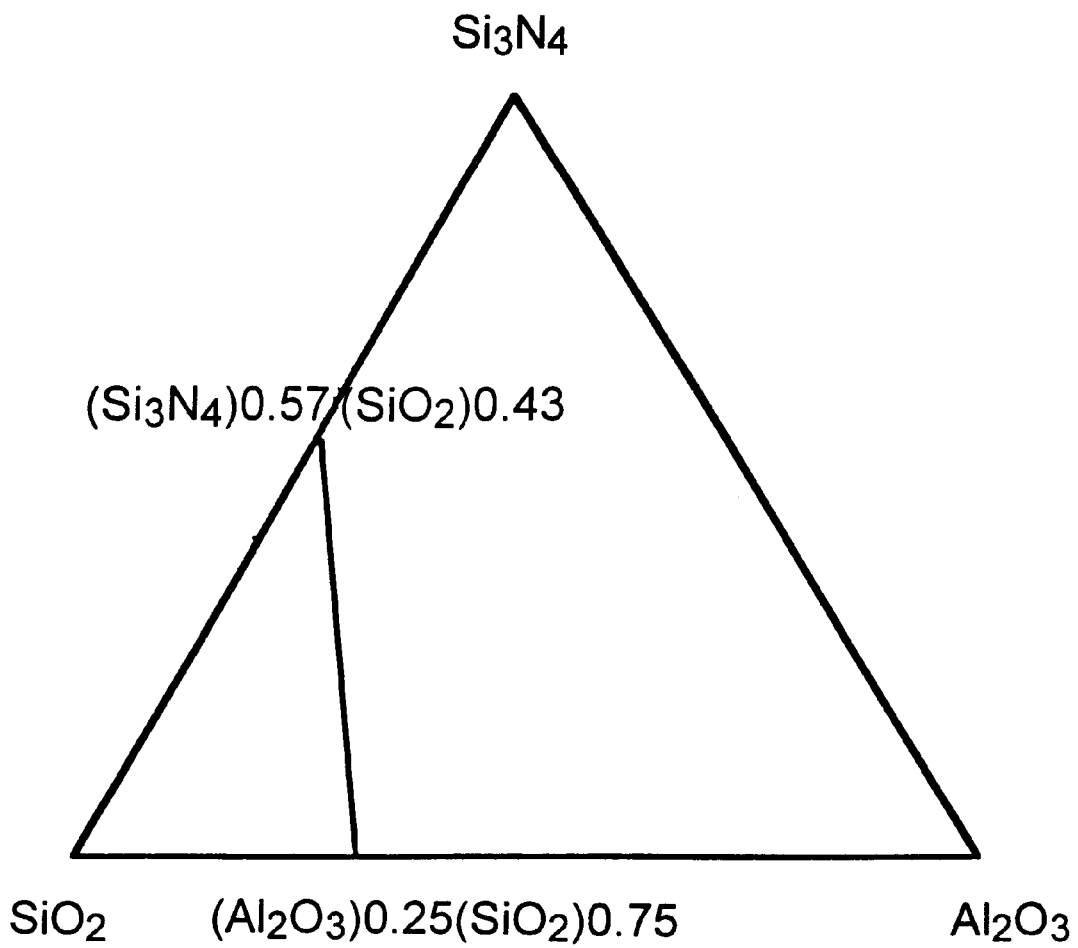
FIG. 4 depicts the compositions of aluminum silicon oxynitride alloys that can be used to form STI dielectrics that minimize resulting stress in the shallow trench. The line connecting the two alloys represents the compositional range of alloys where the thermal expansion coefficients are similar to that of silicon.

EXAMPLE 2
Matching the Linear Thermal Expansion Coefficient of Silicon Using Aluminum Silicon Oxynitride Alloys An aluminum silicon oxynitride (Al—Si—O—N) alloy dielectric also can be formed to match the thermal expansion coefficient of silicon. $Si_3N_4$ has a thermal expansion coefficient of 4.2E-6/° C. Excluding the aluminum component, a mixture of $(Si_3N_4)_{0.57}(SiO_2)_{0.43}$ can achieve approximately a thermal expansion match to silicon. Therefore a Al—Si—O—N mixture of matching thermal expansion would be a continuous mixture in the range of $(Al_2O_3)_{0.25}(SiO_2)_{0.75}$ to $(Si_3N_4)_{0.57}(SiO_2)_{0.43}$. In FIG. 4 the line between the two compositions describes the working dielectric solutions.

EXAMPLE 3
Shallow Trench Isolation Method

For CMOS of L<0.25 μm, shallow trench isolation is becoming more sensitive to stress for narrow devices W<0.5 μm. For the shallow trench isolation trench dielectric fill, a material is used to match the expansion of silicon in the substrate, thus minimizing stress. An Al containing MOCVD gas precursor is added to a conventional shallow trench isolation fill process, i.e., $SiH_4+O2$ HDP or TEOS+$O_3$ SACVD to form an Al—Si—O dielectric alloy. For a High Density Plasma (HDP) STI fill process, the Si wafer at 200–400° C. would be exposed to the 3 gasses, SiH4, O2, Al MOCVD (Metal Organic Chemical Vapor Deposition) gas, reacted at low pressure in the plasma. For Sub-Atmospheric Chemical Vapor Deposition (SACVD) fill process, the same 3 gasses would react without a plasma, but would need a higher wafer temperature, 400–700° C. The $Al_2O_3$ content in the resulting aluminosilicate alloy is in the 20–40% range with the balance being $SiO_2$ where the linear thermal expansion coefficient is matched to that of silicon in the substrate.

Figure 5A:
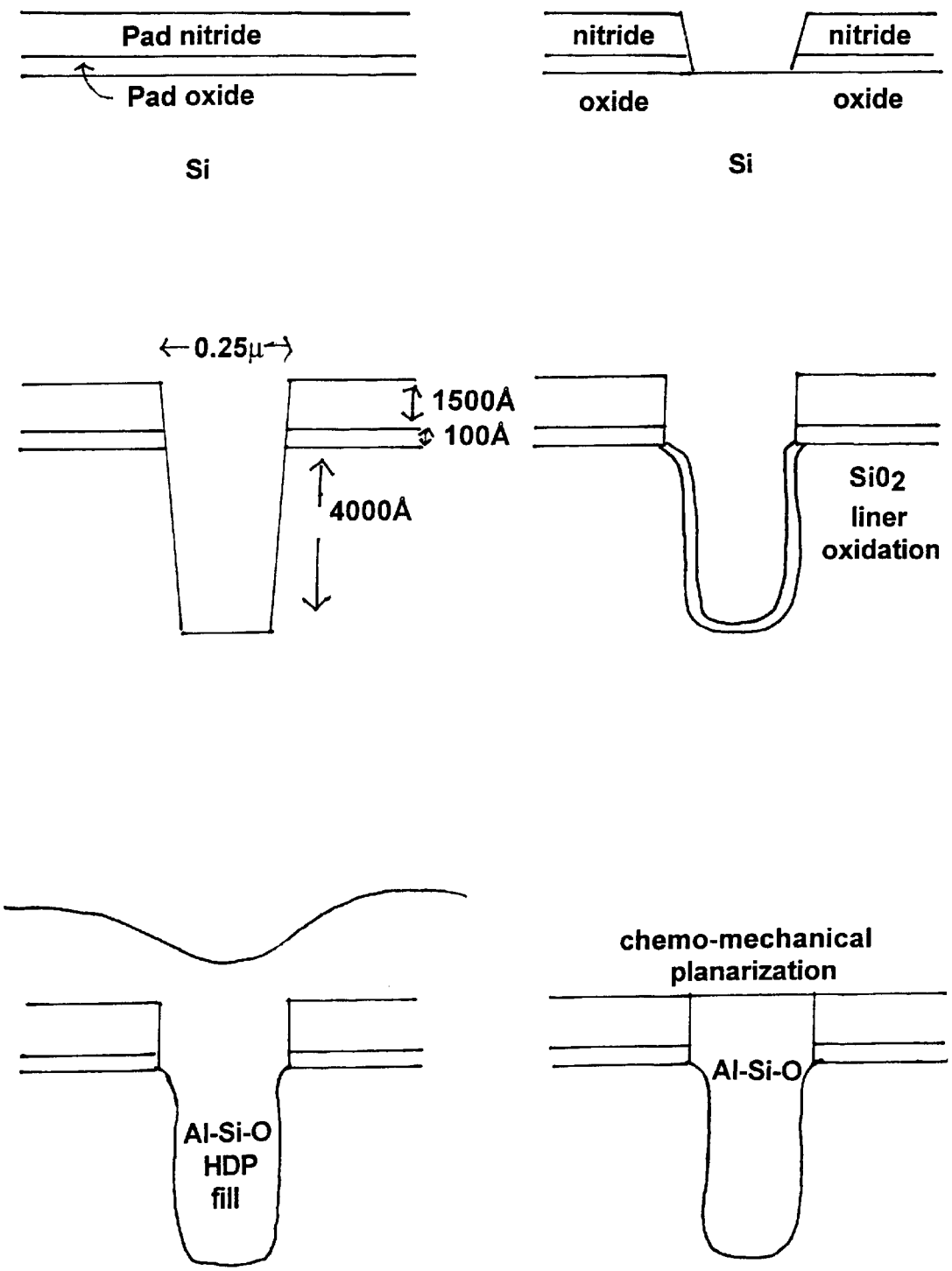
FIG. 5 shows a scheme for the formation of a MOSFET device comprising an STI structure having a n aluminosilicate alloy dielectric and an NMOS transistor.

A shallow trench isolation process flow for an NMOS device is shown in FIG. 5A. Initially, a pad oxide film, about 100 Å, followed by a pad nitride film, about 1500 Å, are deposited on a surface of a silicon substrate. A shallow trench is formed in this silicon substrate to a depth of about 4000 Å and a width at the film surface of 0.25 μm. A liner oxide is formed on the sidewalls of the shallow trench by oxidation of the silicon in either an oxygen or an oxygen/hydrogen ambient at a temperature greater than about 1100° C.

At this point a dielectric may be used to fill the shallow trench. In many processes, silicon dioxide or polysilicon may be used as the dielectric fill. However, as previously stated, although $SiO_2$ is an excellent insulator, the significant differences between the linear thermal expansion coefficients of silicon and silicon dioxide cause stress related problems at the trench sidewalls and particularly the trench edge during subsequent thermal processing steps. An aluminosilicate alloy as the dielectric material provides a better dielectric fill; the ability of the aluminosilicate alloy to expand and contract with the silicon in the substrate during thermal processing steps minimizes stress and yields better performance of the NMOS device.

An aluminosilicate alloy is created during the trench fill process if Al MOCVD precursors, e.g., $Al(CH_3)_3$, Al$(OCH_3)_3$, $C_{12}H_{27}AlO_3$, and $C_{15}H_{21}AlO_6$, are added to conventional deposition processes. Al being a solid at room temperature is not easily deliverable to a Si wafer. Al is therefore brought in the form of a MOCVD gas that can flow into a sub-atmospheric reaction chamber. Al can also be delivered by producing a gas from an Al MOCVD liquid pumped to a hot vaporizer. If the Al MOCVD material is a solid, it can be dissolved in a solvent such as octane and vaporized along with the solvent to provide delivery to the wafer.

Adding an aluminum trioxide precursor to $SiH_4+O_2$ in an HDP process or to $TEOS+O_3$ in an SACVD process results in a dielectric trench fill comprised of about 20–40% $Al_2O_3$ with the balance being $SiO_2$. Furthermore, the inclusion of a nitrogen source during an HDP deposition creates an aluminum silicon oxynitride (Al—Si—O—N) dielectric that also matches the thermal expansion coefficient of silicon. In fact, with the inclusion of sufficient nitrogen, the aluminum component of the alloy can be excluded entirely and the thermal expansion coefficient of silicon still can be matched to a degree to insure a reduction in stress.

Figure 5B:
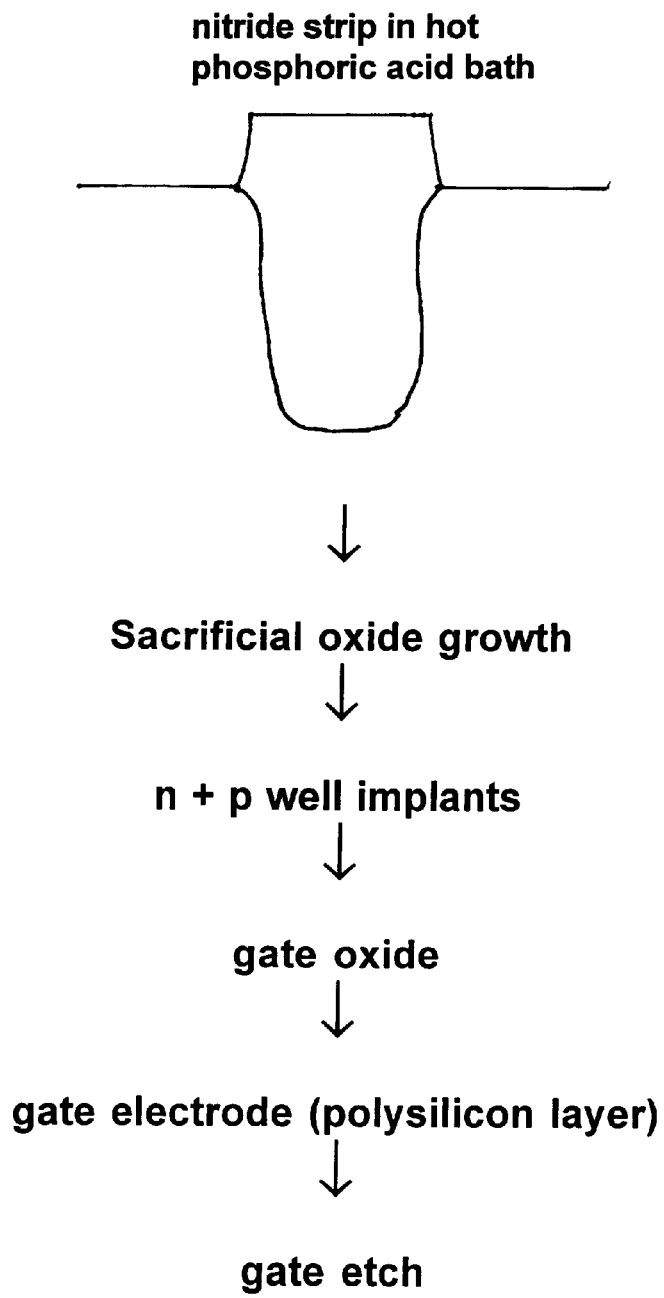

The aluminosilicate dielectric is planarized by chemo-mechanical polishing (CMP) and a nitride strip in a hot phosphoric acid bath is performed. The NMOS device can be constructed; a sacrificial oxide layer is deposited, the n+p wells implanted, a gate oxide deposited and a polysilicon gate electrode deposited followed by a gate etch (FIG. 5B).

EXAMPLE 4
Modification of Boron Solubility in the Trench Dielectric

Boron is a rapid diffuser in polysilicon and oxide. After the gate oxidation step, significant boron segregation to the trench sidewalls occurs. This contributes to faster Vt roll-off in the NMOS device. Also, interstitials that are injected from the source/drain implants cause boron re-distribution at the trench corners and sidewalls as well as at the gate edge. Changing the dielectric fill material from $SiO_2$ to an aluminosilicate alloy modifies the solid solubility of boron in the trench dielectric, potentially reducing PWell out diffusion that affects NMOS threshold voltage (Vt) of narrow transistors.

EXAMPLE 5
Reduction in Diode Leakage Associated with Stress

Stress induced from shallow trench isolation processes can promote increases in diode leakage currents. STI causes compressive stress in the active area and tensile stress underneath the trenches. Although tensile stress underneath the trenches remains constant as line width is reduced, compressive stress at the active area increases. Furthermore, scaling down a n NMOS device thereby reducing the junction width and the trench dimensions increases the variation of the diode leakage current within the same type of device. Reducing the junction width to submicron dimensions can increase the leakage current by a factor of two, eighty percent of which is induced by stress effect. Therefore, elimination of stress factors, particularly as the junction and the trench dimensions are scaled down, will keep the diode leakage variation at the junction as low as possible.

One skilled in the art will readily appreciate that the present invention is well adapted to carry out the objects and obtain the ends and advantages mentioned, as well as those inherent therein. It will be apparent to those skilled in the art that various modifications and variations can be made in practicing the present invention without departing from the spirit or scope of the invention. Changes therein and other uses will occur to those skilled in the art which are encompassed within the spirit of the invention as defined by the scope of the claims.

What is claimed is:

1. A method of reducing stress in a shallow trench isolation region of a MOSFET device comprising the step of:

forming an aluminum silicon oxynitride dielectric in the shallow trench isolation region, wherein the thermal expansion coefficient of the an aluminum silicon oxynitride dielectric approximates the thermal expansion coefficient of silicon in the substrate, thereby reducing stress in the shallow trench isolation region.

2. The method of claim 1, wherein the MOSFET device is selected from the group consisting of NMOS, CMOS, PMOS, BiCMOS, Flash, SRAM and DRAM.

3. The method of claim 1, wherein forming the dielectric in the shallow trench isolation region comprises the steps of:

(a) adding an aluminum trioxide precursor during deposition of silicon dioxide in a shallow trench isolation trench fill process in the device; and (b) depositing an aluminosilicate alloy in the shallow trench thereby forming the dielectric.

4. The method of claim 3, wherein the aluminum trioxide precursor is selected from the group consisting of trimethyl, aluminum, aluminum trimethoxide, aluminum tri-sec-butoxide, and aluminum tris(acetylacetonate).

5. The method of claim 3, wherein said aluminum trioxide precursor is added during a sub-atmospheric chemical vapor deposition of silicon dioxide in the shallow trench.

6. The method of claim 5, wherein the sub-atmospheric chemical deposition of silicon dioxide utilizes tetraethylorthosilicate and ozone.

7. The method of claim 3, wherein said aluminum trioxide precursor is added during a high density plasma deposition of silicon dioxide into the shallow trench.

8. The method of claim 7, wherein the high density plasma deposition of silicon oxide utilizes silane and oxygen.

9. The method of claim 7, further comprising the step of adding a nitrogen source during the high density plasma deposition of silicon dioxide into the shallow trench.

10. A method of reducing stress in a shallow trench isolation region of a MOSFET device comprising the step of:

forming a an aluminum silicon oxynitride alloy dielectric in the shallow trench isolation region, wherein the thermal expansion coefficient of the dielectric approximates the thermal expansion coefficient of silicon in the substrate, thereby reducing stress in the shallow trench isolation region and wherein said an aluminum silicon oxynitride alloy dielectric is formed by a high density plasma process utilizing an aluminum trioxide precursor and a nitrogren source gas and an oxygen source gas.

11. The method of claim 10, wherein the aluminum silicon oxynitride alloy comprises a composition ranging from about 25% aluminum trioxide and about 0% silicon nitride alloyed with about 75% silicon dioxide to about 0% aluminum trioxide and about 57% silicon nitride alloyed with abut 43% silicon oxide.

12. A method of reducing stress in a shallow trench isolation region of a MOSFET device comprising the steps of:

(a) adding an aluminum trioxide precursor selected from the group consisting of aluminum trimethoxide, aluminum tri-sec-butoxide, and aluminum tris(acetylacetonate) during deposition of silicon dioxide in a shallow trench isolation trench fill process in the device; and (b) depositing an aluminum silicon oxynitride alloy in the shallow trench such that a dielectric is formed in the shallow trench isolation region wherein the thermal expansion coefficient of the dielectric approximates the thermal expansion coefficient of silicon in the substrate, thereby reducing stress in the shallow trench isolation region.

13. A method of forming a dielectric filled, shallow trench isolation region for a MOSFET device, comprising the steps of:
   (a) forming a pad oxide film on a semiconductor substrate;
   (b) forming a pad nitride film on the pad oxide film;
   (c) forming a shallow trench in a field region of the semiconductor substrate through the pad nitride film and the pad oxide film;
   (d) forming a liner oxide film at the inner walls of the shallow trench by oxidizing the semiconductor substrate;
   (e) filling the shallow trench with an aluminum silicon oxynitride dielectric alloy wherein filling the shallow trench with an aluminum silicon oxynitride dielectric alloy comprises:
      adding an aluminum trioxide precursor to silane and oxygen; and
      depositing an aluminum silicon oxynitride alloy into the shallow trench by high density plasma deposition; and
   (f) planarizing the surface of the aluminum silicon oxynitride dielectric alloy thereby forming a shallow trench isolation regions.

14. The method of claim 13, wherein the MOSFET device is selected from the group consisting of NMOS, CMOS, PMOS, BiCMOS, Flash, SRAM, AND DRAM.

15. The method of claim 13, wherein the liner oxide is formed at a temperature greater than about 1100° C. and in an ambient comprising oxygen or oxygen and hydrogen.

16. The method of claim 13, wherein the aluminum trioxide precursor is selected from the group consisting trimethyl aluminum, aluminum trimethoxide, aluminum tri-sec-butoxide, and aluminum tris(acetylacetonate).

17. The method of claim 13, wherein the aluminum silicon oxynitride alloy comprises from about 20% to about 40% aluminum trioxide alloyed with silicon dioxide.

18. A method of forming a dielectric filled, shallow trench isolation region for a MOSFET device, comprising the steps of:
   (a) forming a pad oxide film on a semiconductor substrate;
   (b) forming a pad nitride film on the pad oxide film;
   (c) forming a shallow trench in a field region of the semiconductor substrate through the pad nitride film and the pad oxide film;
   (d) forming a liner oxide film at the inner walls of the shallow trench by oxidizing the semiconductor substrate;
   (e) filling the shallow trench with an aluminum silicon oxynitride alloy by a high density plasma process; and
   (f) planarizing the surface of the aluminosilicate dielectric alloy thereby forming a shallow trench isolation regions.

19. The method of claim 18, wherein the aluminum silicon oxynitride alloy comprises a composition ranging from about 25% aluminum trioxide and about 0% silicon nitride alloyed with abut 75% silicon dioxide to about 0% aluminum trioxide and about 57% silicon nitride alloyed with about 43% silicon oxide.

* * * * *